United States Patent
Holland

(10) Patent No.: US 6,319,355 B1
(45) Date of Patent: Nov. 20, 2001

(54) PLASMA PROCESSOR WITH COIL RESPONSIVE TO VARIABLE AMPLITUDE RF ENVELOPE

(75) Inventor: John Patrick Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/343,246

(22) Filed: Jun. 30, 1999

(51) Int. Cl.$^7$ .................................................. H05H 1/00

(52) U.S. Cl. ........................... 156/345; 118/723 I

(58) Field of Search ............................ 156/345; 118/723 I

(56) References Cited

U.S. PATENT DOCUMENTS

| | | |
|---|---|---|
| 4,891,118 | 1/1990 | Ooiwa et al. . |
| 4,948,458 | 8/1990 | Ogle . |
| 5,226,967 | 7/1993 | Chen et al. . |
| 5,277,751 | 1/1994 | Ogle . |
| 5,304,279 | 4/1994 | Coultas et al. . |
| 5,310,452 | 5/1994 | Doki et al. . |
| 5,368,710 | 11/1994 | Chen et al. . |
| 5,401,350 | 3/1995 | Patrick et al. . |
| 5,558,722 | 9/1996 | Okumura et al. . |
| 5,731,565 * | 3/1998 | Gates . |
| 5,759,280 | 6/1998 | Holland et al. . |
| 5,795,429 | 8/1998 | Ishii et al. . |
| 5,800,619 | 9/1998 | Holland et al. . |
| 5,827,435 * | 10/1998 | Samukawa . |
| 5,897,713 * | 4/1999 | Tomioka et al. . |

FOREIGN PATENT DOCUMENTS

| | | |
|---|---|---|
| 08 13 227 A2 * | 12/1997 | (EP) . |
| 3-323326 * | 6/1991 | (JP) . |
| 99/07913 | 2/1999 | (WO) . |

OTHER PUBLICATIONS

H. Sugai et al., "Diagnostics and control of radicals in an inductively coupled etching reactor," XP–002148446, J. Vac. Sci. Technol. A 13(3), May/Jun 1995, pp. 887–893.*

Seiji Samukawa, et al., "Pulsed–time–modulated Electron Cyclotron Resonance Plasma Discharge for Highly Selective, Highly Anistoropic, and Charge–free Etching," J. VAc. Sci. Technol. A 14(6), Nov/Dec 1996, 1996 American Vacuum Society, pp. 3049–3058.

Sumio Ashida, et al., "Time Modulated Operation of High Density Plasma Sources," 1995 Dry Process Symposium, pp. 21–26.

A. Yokozawa, et al., "Simulation for Afterglow Plasma in Time–modulated Cl $_2$Plasma," 1995 Dry Process Symposium, pp. 27–32.

Sumio Ashida, et al., "Measurements of Pulsed–power Modulated Argon Plasmas in an Inductively Coupled Plasma Source,"J. Vac. Sci. Technol. A 14(2), Mar/Apr 1996, 1996 American Vacuum Society, pp. 391–397.

H. Sugai, et al., "Diagnostics and Control of Radicals in an Inductivity Coupled Etching Reactor," J. Vac. Sci. Technol. A 13(3), May/Jun 1995, 1995 American Vacuum Society, pp. 887–893.

(List continued on next page.)

Primary Examiner—Thi Dang
(74) Attorney, Agent, or Firm—Lowe Hauptman Gilman & Berner, LLP

(57) ABSTRACT

A vacuum plasma processor includes a coil for reactively exciting a plasma so plasma incident on a workpiece has substantially uniformity. The coil and a window which reactively couples fields from the coil to the plasma have approximately the same diameter. An r.f. source supplies a pulse amplitude modulated envelope including an r.f. carrier to the coil.

39 Claims, 2 Drawing Sheets

OTHER PUBLICATIONS

Seiji Samukawa, et al., "Pulsed–time Modulated Electron Cyclotron Resonance Plasma Etching for Highly Selective, Highly Anisotropic, and Less–charging Polycrystalline Silicon Patterning," J. Vac. Sci. Technol. B 12(6), Nov/Dec 1994, American Vacuum Society, pp. 3300–3305.

Seiji Samukawa, "Time–modulated Electron Cyclotron Resonance Plasma Discharge for Controlling the Polymerization in $SiO_2$ Etching", Jpn. J. Appl. Phys. vol. 32 (1993) pp. 6080–6087, Part 1, No. 12B, Dec. 1993.

Nobuo Fujiware, et al., "Pulse Plasma Processing for Reduction of Profile Distortion Induced by Charge Build–up in ECR Plasma," 1995 Dry Process Symposium, pp. 51–56.

Seiji Samukawa, "Highly Selective and Highly Anisotropic $SiO_2$ Etching in Pulse–time Modulated Electron Cyclotron Resonance Plasma," Jpn. J. Appl. Phys. vol. 33 (1994) pp. 2133–2138, Part 1, No. 4B, Apr. 1994.

Shigenori Sakamori, et al., "Reduction of Electron Shading Damage with Pulse–modulated ECR Plasma," 1997 2nd International Symposium on Plasma Process–induced Damage, May 13–14, Monterey, CA, Copyright 1997 American Vacuum Society, pp. 55–58.

K. Hashimoto et al., "Reduction of Electron Shading Damage by Using Synchronous bias in Pulsed Plasma," 1995 Dry Process Symposium, pp. 33–37.

* cited by examiner

PLASMA PROCESSOR WITH COIL RESPONSIVE TO VARIABLE AMPLITUDE RF ENVELOPE

FIELD OF INVENTION

The present invention relates generally to plasma processors including radio frequency (r.f.) responsive coils for exciting gases in vacuum chambers to plasmas that process workpieces in the chamber and more particularly to such a processor and to a processing method wherein plasma density on the workpiece is controlled by varying the amplitude of the envelope of the r.f. applied to the coil.

BACKGROUND ART

One type of processor for treating workpieces with an r.f. plasma in a vacuum chamber includes a coil responsive to an r.f. source. The coil responds to the r.f. source to produce magnetic and electric fields that excite ionizable gas in the chamber to a plasma. Usually the coil is on or adjacent to a dielectric window that extends in a direction generally parallel to a planar horizontally extending surface of the processed workpiece. The excited plasma interacts with the workpiece in the chamber to etch the workpiece or to deposit material on it. The workpiece is typically a semiconductor wafer having a planar circular surface or a solid dielectric plate, e.g., a rectangular glass substrate used in flat panel displays, or a metal plate.

Ogle, U.S. Pat. No. 4,948,458 discloses a multi-turn spiral coil for achieving the above results. The spiral, which is generally of the Archimedes type, extends radially and circumferentially between its interior and exterior terminals connected to the r.f. source via an impedance matching network. Coils of this general type produce oscillating r.f. fields having magnetic and capacitive field components that propagate through the dielectric window to heat electrons in the gas in a portion of the plasma in the chamber close to the window. The oscillating r.f. fields induce in the plasma currents that heat electrons in the plasma. The spatial distribution of the magnetic field in the plasma portion close to the window is a function of the sum of individual magnetic field components produced by each turn of the coil. The magnetic field component produced by each of the turns is a function of the magnitude of r.f. current in each turn which differs for different turns because of transmission line effects of the coil at the frequency of the r.f. source.

For spiral designs as disclosed by and based on the Ogle '458 patent, the r.f. currents in the spiral coil are distributed to produce a torroidal shaped magnetic field region in the portion of the plasma close to the window, which is where power is absorbed by the gas to excite the gas to a plasma. At low pressures, in the 1.0 to 10 mTorr range, diffusion of the plasma from the ring shaped region produces plasma density peaks just above the workpiece in central and peripheral portions of the chamber, so the peak densities of the ions and electrons which process the workpiece are in proximity to the workpiece center line and workpiece periphery. At intermediate pressure ranges, in the 10 to 100 mTorr range, gas phase collisions of electrons, ions, and neutrons in the plasma prevent substantial diffusion of the plasma charged particles outside of the torroidal region. As a result, there is a relatively high plasma flux in a ring like region of the workpiece but low plasma fluxes in the center and peripheral workpiece portions.

These differing operating conditions result in substantially large plasma flux (i.e., plasma density) variations between the ring and the volumes inside and outside of the ring, resulting in a substantial standard deviation, i.e., in excess of three, of the plasma flux incident on the workpiece. The substantial standard deviation of the plasma flux incident on the workpiece has a tendency to cause non-uniform workpiece processing, i.e, different portions of the workpiece are etched to different extents and/or have different amounts of molecules deposited on them.

Many coils have been designed to improve the uniformity of the plasma. The commonly assigned U.S. Pat. No. 5,759,280, Holland et al., issued Jun. 2, 1998, discloses a coil which, in the commercial embodiment, has a diameter of 12 inches and is operated in conjunction with a vacuum chamber having a 14.0 inch inner wall circular diameter. The coil applies magnetic and electric fields to the chamber interior via a quartz window having a 14.7 inch diameter and 0.8 inch uniform thickness. Circular semiconductor wafer workpieces are positioned on a workpiece holder about 4.7 inches below a bottom face of the window so the center of each workpiece is coincident with a center line of the coil.

The coil of the '280 patent produces considerably smaller plasma flux variations across the workpiece than the coil of the '458 patent. The standard deviation of the plasma flux produced by the coil of the '280 patent on a 200 mm wafer in such a chamber operating at 5 milliTorr is about 2.0, a considerable improvement over the standard deviation of approximately 3.0 for a coil of the '458 patent operating under the same conditions. The coil of the '280 patent causes the magnetic field to be such that the plasma density in the center of the workpiece is greater than in an intermediate part of the workpiece, which in turn exceeds the plasma density in the periphery of the workpiece. The plasma density variations in the different portions of the chamber for the coil of the '280 patent are much smaller than those of the coil of the '458 patent for the same operating conditions as produce the lower standard deviation.

Other arrangements directed to improving the uniformity of the plasma density incident on a workpiece have also concentrated on geometric principles, usually concerning coil geometry. See, e.g., U.S. Pat. Nos. 5,304,279, 5,277,751, 5,226,967, 5,368,710, 5,800,619, 5,401,350, and 5,847,704.

It is accordingly an object of the present invention to provide a new and improved vacuum plasma processor and method of operating same wherein the plasma density incident on the workpiece can be controlled at will.

An additional object of the present invention to provide a new and improved vacuum plasma processor and method of operating same wherein the plasma density incident on the workpiece has relatively high uniformity.

Another object of the invention is to provide a new and improved vacuum plasma processor having the same geometry as the prior art but which is operated to have controlled plasma density characteristics.

An added object of the invention is to provide a new and improved vacuum plasma processor having the same geometry as the prior art but which is operated to have greater plasma density uniformity characteristics than the prior art.

A further object of the invention is to provide a new and improved vacuum plasma processor including an r.f. excitation coil that is operated so the plasma density incident on a workpiece is substantially less than 2.0.

SUMMARY OF THE INVENTION

I have discovered that the foregoing objects are attained by varying the amplitude of the envelope of r.f. applied to a plasma excitation coil, such as the coil disclosed in the '280 patent.

In one embodiment, the invention is directed to a vacuum plasma processor for processing workpieces that includes (1) a vacuum chamber for processing the workpieces with a plasma, (2) a holder in the chamber for the workpieces, (3) a coil for exciting gas in the chamber into the plasma, and (4) an r.f. source for supplying an r.f. carrier to the coil having a variable amplitude envelope wherein the (a) variable envelope amplitude, (b) pressure within the chamber, and (c) arrangement of the (i) the coil, (ii) chamber and (iii) holder are such as to cause the plasma to have a substantially constant flux across the workpiece while the workpiece is on the holder.

A further aspect of the invention relates to a method of plasma processing a workpiece on a holder in a vacuum plasma processor chamber by exciting gas in the chamber to a plasma by applying an r.f. carrier having envelope amplitude variations to a coil that responds to the r.f. carrier to couple magnetic and electric plasma excitation fields to the plasma. The variations of the envelope amplitude and the coil geometry, as well as the arrangement of the chamber, workpiece and holder, are such that the density of the plasma across the workpiece has substantially lower standard deviation than when the plasma envelope has a constant amplitude. Hence controlling the variations of the envelope amplitude maintains the density of the plasma across the workpiece substantially constant.

Another aspect of the invention relates to a vacuum plasma processor including a workpiece holder in a vacuum chamber, and a coil for exciting gas in the chamber into the plasma driven by an r.f. source having a variable amplitude envelope wherein the variable amplitude, pressure within the chamber, and the arrangement of (a) the coil, (b) the chamber and (c) the holder cause the plasma to have a higher flux on a portion of the workpiece aligned with the center of the coil than on a portion of the workpiece aligned with a portion of the coil removed from the center of the coil when a constant amplitude r.f. envelope is applied to the coil, and the variable amplitude envelope causes the plasma flux across the workpiece to be such as to cause the plasma flux in a portion of the workpiece removed from the portion of the workpiece aligned with the center of the coil to be at least equal to the plasma flux in the portion of the workpiece aligned with the center of the coil.

An added aspect of the invention concerns such a vacuum plasma processor wherein the source driving the coil is arranged so that the amplitude of the high amplitude segments increases with increases in the spacing of the high amplitude segments from each other.

A further aspect of the invention concerns such a plasma processor wherein the variable amplitude envelope of an r.f. source driving the coil is controlled so that the plasma flux on a portion of the workpiece removed from a portion of the workpiece aligned with the center of the coil is at least equal to the plasma flux at a portion of the workpiece aligned with the center of the coil.

The variable amplitude envelope preferably has high and low amplitude portions. The low amplitude portions have a low enough magnitude to prevent excitation of charge particles in the gas to a plasma. The sufficient duration and magnitude of each low amplitude portion are such as to enable charge particles in the plasma to diffuse to a much greater extent than charge particle diffusion which occurs when the envelope has a high value to excite the plasma to a state which causes processing of the workpiece.

Preferably the variable amplitude envelope is in the form of pulses having zero amplitude periods spaced between finite amplitude periods. The zero amplitude durations are, in one embodiment, short enough that the plasma is not extinguished during them (e.g., the period is approximately ten microseconds) and, in a second embodiment, are long enough that the plasma is extinguished during them (e.g., the period of the zero amplitude is about ten milliseconds).

I am aware that there are disclosures in the prior art of pulsing a plasma excitation source. In particular, I am aware of the following: Sumio Ashida, M. R. Shim and M. A. Lieberman, "Measurements of Pulsed-power Modulated Argon Plasmas in an Inductively Coupled Plasma Source," J. Vac. Sci. Technol. A 14(2), March/April 1996, 1996 *American Vacuum Society,* pages 391–397; H. Sugai and K. Nakamura, "Diagnostics and Control of Radicals in an Inductively Coupled Etching Reactor," J. Vac. Sci. Technol. A 13(3), May/June 1995, 1995 *American Vacuum Society,* pages 887–893; Seiji Samukawa and Kazuo Terada, "Pulse-time Modulated Electron Cyclotron Resonance Plasma Etching for Highly Selective, Highly Anisotropic, and Less-charging Polycrystalline Silicon Patterning," J. Vac. Sci. Technol. B 12(6), November/December 1994, *American Vacuum Society,* PAGES 3300–3305; Seiji Samukawa, "Time-modulated Electron Cyclotron Resonance Plasma Discharge for Controlling the Polymerization in $SiO_2$ Etching," Jpn. J. Appl. Phys. Vol. 32 (1993), pages 6080–6087, Part 1, No. 12B, December 1993; Nobuo Fujiwara, Takahiro Maruyama and Masahiro Yoneda, "Pulse Plasma Processing for Reduction of Profile Distortion Induced by Charge Build-up in ECR Plasma," 1995 Dry Process Symposium, pages 51–56; Seiji Samukawa, "Highly Selective and Highly Anisotropic $SiO_2$ Etching in Pulse-time Modulated Electron Cyclotron Resonance Plasma," Jpn. J. Appl. Phys. Vol. 33 (1994) pages 2133–2138, Part 1, No. 4B, April 1994; Shigenori Sakamori, Takahiro Maruyama, Nobuo Fujiwara, Hiroshi Miyatake and Masahiro Yoneda, "Reduction of Electron Shading Damage with Pulse-modulated ECR Plasma," 1997 2nd International Symposium on Plasma Process-Induced Damage, May 13–14, Monterey, Calif., 1997 *American Vacuum Society,* pages 55–58; K. Hashimoto, Y. Hikosaka, A. Hasegawa and M. Nakamura, "Reduction of Electron Shading Damage by Using Synchronous Bias in Pulsed Plasma," 1995 Dry Process Symposium, pages 33–37; Samukawa, "Plasma Processing Method and Equipment used Therefor" U.S. Pat. No. 5,827,435, issued Oct. 27, 1998; Ooiwa et al., "Plasma Processing Apparatus" U.S. Pat. No. 4,891,118, issued Jan. 2, 1990; Doki et al. "Plasma Process Apparatus and Plasma Processing Method" U.S. Pat. No. 5,310,452, issued May 10, 1994.

While several of these references deal with plasmas excited by coils, none of the references disclosing such excitation sources indicates the pulsed excitation of the coil has an effect on plasma density uniformity, and in particular improved plasma density uniformity. This is not surprising because the coils mentioned in the references are not disclosed as having geometry conducive to providing plasmas with substantial plasma flux uniformity. In one case, the coil is a solenoid while in other cases the coil appears to be conventional, relatively small conventional flat spiral coil. Such coils do not have a diameter and geometry conducive to providing substantially uniform plasma flux during continuous operation.

In contrast, the coil of the preferred embodiment of the present invention is specifically designed to provide a substantially uniform plasma flux across the entire workpiece. The specific coil is designed to be "centerfast." Pulsing the r.f. field the coil derives enables the plasma to diffuse during the interval between excitation or when low amplitude excitation occurs to promote an "edge-fast" plasma flux and thereby provide substantial plasma flux uniformity across the entire workpiece.

While Samukawa et al. disclose pulsing a microwave electron cyclotron resonance field in their November/December, 1996, Journal of Vacuum Science Technology publication, to attain improved uniformity, the mechanism involved in microwave electron cyclotron resonance operation is entirely different from the mechanisms involved in coil excited plasmas. In an electron cyclotron resonance plasma, a very substantial DC magnetic field must be applied, usually by a solenoid coil, to the plasma to obtain the required swirling action of the charged particles. The DC magnetic field interacts with the microwave energy to provide the plasma excitation. An r.f. plasma does not require a large DC magnetic field source or a microwave generator. An r.f. plasma excited by a coil requires a relatively simple, inexpensive r.f. (non-microwave) source, typically having a frequency of 13.56 mHz, and a relatively inexpensive coil. A further advantage of r.f. coil plasma excitation over microwave excitation is that greater diffusion occurs with a pulsed plasma excited by a coil than can occur with an electron cyclotron resonance process because a plasma excited by a coil is not coupled with a strong DC magnetic field.

The above and still further objects, features and advantages of the present invention will become apparent upon consideration of the following detailed descriptions of several specific embodiments thereof, especially when taken in conjunction with the accompanying drawings.

DETAILED DESCRIPTION OF THE DRAWING

Figure 1:
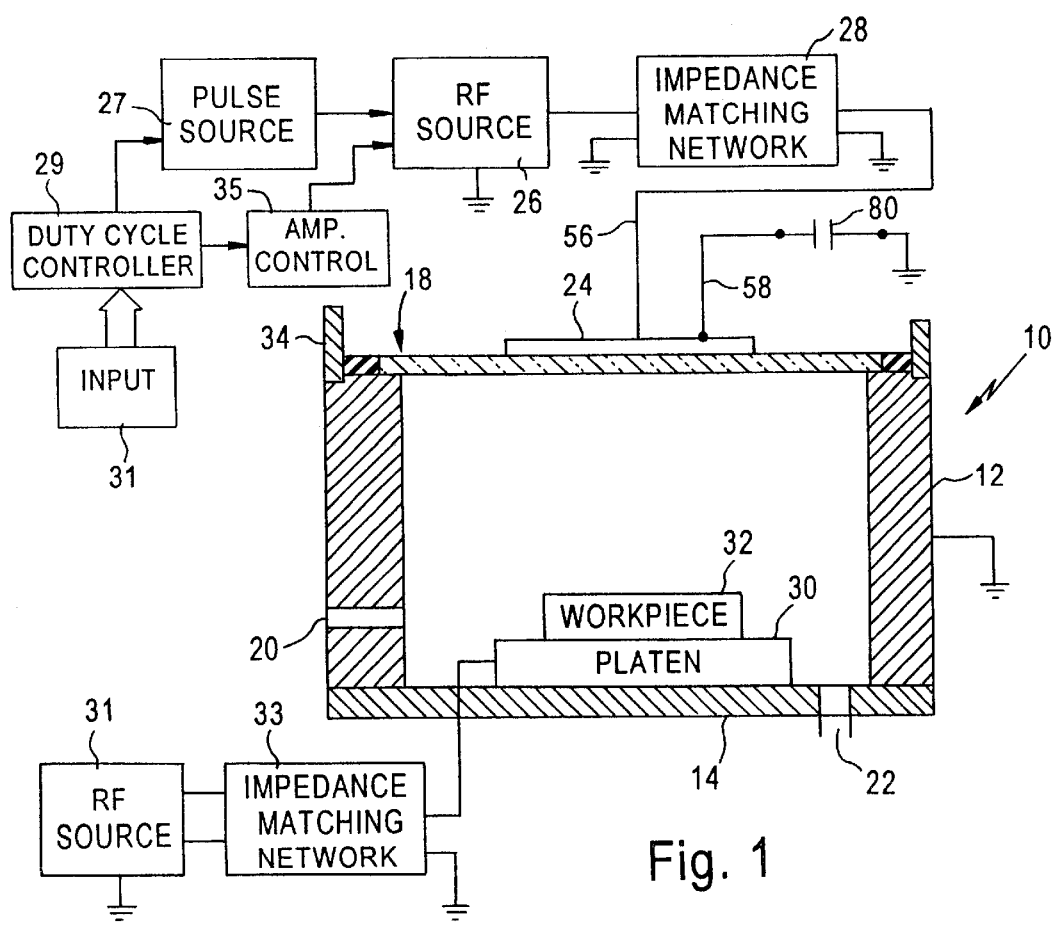
FIG. 1 is a schematic diagram of a preferred embodiment of a vacuum plasma processor using a pulsed r.f. source exciting a coil in accordance with a preferred embodiment of the present invention.

The vacuum plasma workpiece processor of FIG. 1 of the drawing includes vacuum chamber 10, shaped as a cylinder having grounded metal wall 12, metal bottom end plate 14, and circular top plate structure 18, consisting of a dielectric window structure 19, having the same thickness from its center to its periphery. Sealing of vacuum chamber 10 is provided by conventional gaskets (not shown). The processor of FIG. 1 can be used for etching a semiconductor, dielectric or metal substrate or for depositing molecules on such substrates.

A suitable gas that can be excited to a plasma state is supplied to the interior of chamber 10 from a gas source (not shown) via port 20 in side wall 12. The interior of the chamber is maintained in a vacuum condition, at a pressure that can vary in the range of 1–100 milliTorr, by a vacuum pump (not shown), connected to port 22 in end plate 14.

The gas in the chamber is excited to a plasma having a spatially substantially uniform density by a suitable electric source. The electric source includes a substantially planar coil 24, mounted immediately above window 19 and excited by r.f. power source 26 (typically having a fixed frequency of 13.56 mHz) having a variable amplitude envelope provided by periodic pulse source 27. Source 27 turns the r.f. output of source 26 on and off from time to time, preferably periodically. When pulse source 27 turns r.f. source 26 on, the amplitude of the r.f. voltage applied to coil 24 is sufficiently high to produce sufficient current in the coil to generate a high magnetic field. The current in coil 24 generates a large enough magnetic field flux in chamber 10 in proximity to window 19 to excite ionizable gas in the chamber to a plasma. When source 27 turns source 26 off or reduces the voltage of the envelope of the source r.f. output to a relatively low value the magnetic field coil 24 applies to the gas in chamber 10 is insufficient to excite the gas to a plasma state. As a result there is much greater charge particle diffusion than the charge particle diffusion which occurs when the r.f. envelope applied to coil 24 has a high value.

Impedance matching network 28, connected between output terminals of r.f. source 26 and excitation terminals of coil 24, couples the variable amplitude envelope the r.f. source derives to the coil. Impedance matching network 28 includes variable reactances (not shown) which a controller varies in a known manner to achieve impedance matching between source 26 and a load including coil 24 and the plasma load the coil drives.

Duty cycle controller 29 responds to input device 31 to control the duration of the pulses source 27 derives. Input device 31 can be a manual device, such as a potentiometer or numeric duty cycle per cent representing keys of a key pad, or a microprocessor responsive to signals stored in a computer memory for different processing recipes of workpiece 32. Variables of the recipes include (1) species of gases flowing through port 22 into chamber 10, (2) pressure in chamber 10 controlled by the vacuum pump connected to port 20, (3) duty cycle of the r.f. envelope source 26 derives in response to the pulses source 27 derives, and (4) average power r.f. source 26 supplies to coil 24.

I have found that etch rate of material from workpiece 32 by the plasma in chamber 10 depends on average power of the plasma. Usually etch rate is desirably maintained constant. Consequently, peak power and duty cycle are desirably inverse functions of each other so that as the duty cycle of r.f. source 26 increases the envelope of the r.f. voltage source 26 derives decreases in a reciprocal manner and vice versa for decreases in the duty cycle of source 26.

To these ends, duty cycle controller 29 supplies amplitude controller 35 with a signal having an amplitude that is inversely proportional to the duty cycle of the control signal controller 29 supplies to pulse source 27. Amplitude controller 35 responds to the signal from controller 29 to vary the output voltage and power of the r.f. envelope source 26 supplies to coil 24. The recipe controls the initial, continuous wave (100% duty cycle) amplitude of the envelope source 26 derives. The recipe also causes the signal from controller 35 to increase the envelope amplitude as duty cycle decreases. It is to be understood that the amplitude control of the envelope r.f. source derives could also be directly controlled by a separate output of input device 31 in a coordinated manner with the duty cycle of source 27.

Workpiece 32 is fixedly mounted in chamber 10 to a surface of workpiece holder (i.e., chuck) 30; the surface of holder 30 carrying workpiece 32 is parallel to the surface of window 19. Workpiece 32 is usually electrostatically clamped to the surface of holder 30 by a DC potential of a DC power supply (not shown). R.f. source 31 supplies a constant amplitude r.f. voltage to impedance matching network 33, that includes variable reactances (not shown) Matching network 33 couples the output of source 31 to holder 30. A controller (not shown) controls the variable reactances of matching network 33 to match the impedance of source 31 to the impedance of an electrode (not shown) of holder 30. The load coupled to the electrode is primarily the plasma in chamber 10. As is well known the r.f. voltage source 31 applies to the electrode of holder 30 interacts with charge particles in the plasma to produce a DC bias on workpiece 32.

Surrounding planar coil 24 and extending above top end plate 18 is a metal tube or can-like shield 34 having an inner diameter somewhat greater than the inner diameter of wall 12. Shield 34 decouples electromagnetic fields originating in coil 24 from the surrounding environment. The distance between shield 34 and the peripheral regions of coil 24 is large enough to prevent significant absorption by shield 34 of the magnetic fields generated by the peripheral regions of coil 24.

The diameter of cylindrically shaped chamber 10 is large enough to prevent absorption by chamber walls 12 of the magnetic fields generated by the peripheral regions of coil 24. The diameter of dielectric window structure 19 is greater than the diameter of chamber 10 to such an extent that the entire upper surface of chamber 10 is comprised of dielectric window structure 10. The distance between the treated surface of workpiece 32 and the bottom surface of dielectric window structure 19 is chosen to provide the most uniform plasma flux on the exposed, processed surface of the workpiece. For a preferred embodiment of the invention, the distance between the workpiece processed surface and the bottom of the dielectric window is approximately 0.3 to 0.4 times the diameter of chamber 10; the inner diameter of chamber 12 is 14 inches, the diameter of coil 24 is 12 inches, the inner diameter of cylindrical shield 34 is 14.7 inches, and the distance between the workpiece processed surface and the bottom of the dielectric window is 4.7 inches.

Planar coil 24 functions as a transmission line to produce a standing wave pattern along the length of the coil. The standing wave pattern results in variations in the magnitude of the r.f. voltages and currents along the length of the coil. The dependence of the magnetic flux generated by the coil on the magnitude of these r.f. currents results in differing amounts of plasma being produced in different portions of chamber 10 beneath different portions of the coil.

The variations in the r.f. current magnitude flowing in different parts of the coil are spatially averaged to assist in deriving a uniform plasma. Spatially averaging these different current values in the different parts of the coil substantially prevents non-radial asymmetries in the plasma density, particularly at regions of high r.f. current in the coil segments near the coil periphery. The transmission line behavior of the r.f. current in planar coil 24 increases the amount of magnetic flux generated by the peripheral coil segments relative to the center coil segments. This result is achieved by exciting coil 24 with r.f. so the regions of maximum r.f. current are on the peripheral coil segments.

Figure 2:
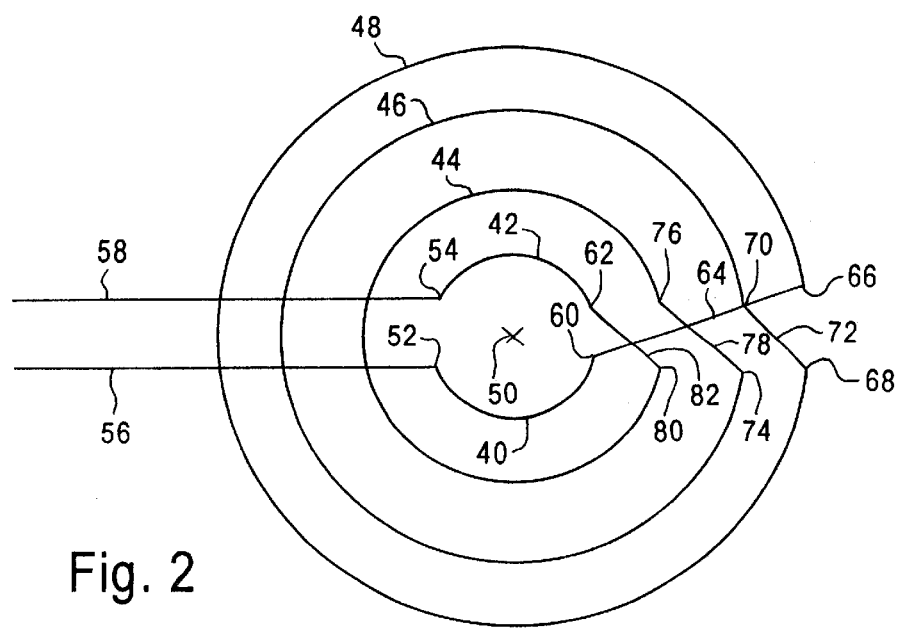
FIG. 2 is a top view of a preferred coil in the processor of FIG. 1.
Figure 3:
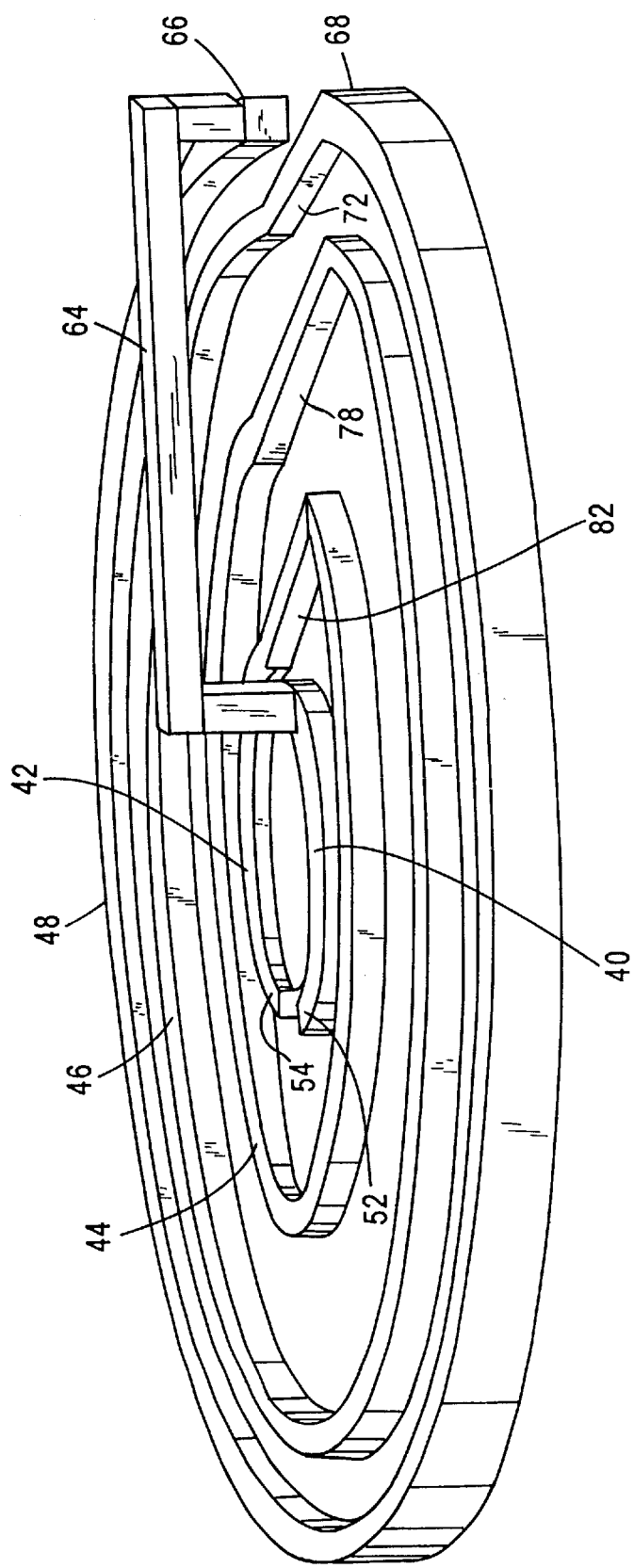
FIG. 3 is a perspective view of the coil illustrated in FIG. 2.

As illustrated in FIGS. 2 and 3, planar coil 24 includes interior substantially semicircular loops 40, 42 and peripheral substantially circular segments 46 and 48 and an intermediate substantially circular segment 44. Loops 40 and 42 form half turns of coil 24 while each of loops 44, 46 and 48 forms almost a complete full turn; the full and half turns are connected in series with each other. All of segments 40, 42, 44, 46 and 48 are coaxial with central coil axis 50, coincident with the center axis of chamber 10. Opposite excitation terminals 52 and 54, in the center portion of coil 24, are respectively coupled by leads 48 and 56 to opposite terminals of r.f. source 26 via matching network 28 and one electrode of capacitor 80, the other electrode of which is grounded. Terminal 60, at the end of loop 40 opposite from terminal 52, is connected to end terminal 66 of outer loop segment 48 by conductive strap 64 which is located in a region slightly above the plane of coil 24 and does not touch any of the coil segments which run beneath it so the strap is electrically insulated from coil 24, except at terminals 60 and 66.

Segment 48 has a second terminal 68 slightly less than 360° from terminal 66; terminal 68 is connected to terminal 70 of loop segment 46 via strap 72. Loop 46, having an angular extent of almost 360°, has a second end terminal 74 connected to terminal 76 of loop 44 via strap 78. Loop 44, having an angular extent of almost 360°, has a second end terminal 80 which is connected by strap 82 to terminal 62 at the end of segment 42 opposite from terminal 54.

Capacitor 80, having a capacitive impedance $Z_{cap}=1/(j2\pi fC)$, where $j=\sqrt{-1}$, f is the frequency of r.f. source 26, and C is the capacitance of capacitor 30, shifts the phase and therefore location of the voltage and current distribution across the entire length of coil 24. The voltage and current distribution are shifted in coil 24 so the coil produces r.f. electric and magnetic fields which provide substantially uniform plasma flux on the processed surface of workpiece 32.

For the preferred embodiment, the voltage and current of coil 24 are distributed by selecting the value of capacitor 80 so the peak-to-peak r.f. current at coil terminal 54 is a minimum and equals the peak-to-peak r.f. current at coil terminal 52. At this condition, the coil has opposite polarity maximum peak-to-peak r.f. voltages at terminals 52 and 54 and the coil maximum r.f. current occurs near conductive strap 72. The distribution of r.f. voltages and currents in the coil can be approximated by $$V_{pkpk}(X)=V°_{pkpk}\cos[\beta(x+x°)]$$

and $$I_{pkpk}(X)=I°_{pkpk}\sin[\beta(x+x°)],$$

where:

x is the linear distance measured from terminal 54 of the coil,

β is the angular frequency of r.f. source 26 (i.e. 2πf), divided by c, the speed of light, x° is an offset from zero which is determined by the value of the capacitor 80, and $V°_{pkpk}$ and $I°_{pkpk}$ are respectively the maximum r.f. peak-to-peak voltages and currents in the coil.

For the preferred embodiment of the coil, the value of capacitor 80 is selected so x° is approximately 0.15 to 0.16 times the wavelength (λ=c/f) of the r.f. current flowing in the coil.

The peripheral regions of coil 24 produce greater magnetic flux than the center region of the coil because the magnitude of the peak-to-peak r.f. currents is greater in the peripheral segment of the coil relative to the magnitudes of the peak-to-peak currents of the central segments. The maximum peak-to-peak r.f. current amplitude occurs in substantially circular loop segment 46. The amplitudes of the peak-to-peak r.f. currents in adjacent loop segments 44 and 48 and in loop segment 46 and the spacing of loop segments 44, 46 and 48 from each other are such that magnetic fluxes from these three loop segments are combined in space to provide a total magnetic flux density, just under window 19, having a maximum value over a relatively broad annular area. The annular area extends from between loop segments 46 and 48 to between intermediate segment 44 and interior segments 40 and 42. The total magnetic flux is also relatively constant as a function of angular coordinate θ, representing the angle about the coil periphery relative to a reference angle that extends through the coil center line 50, e.g., the reference angle extends horizontally in FIG. 2 to the left of center line 50.

A spatially averaged magnetic flux which is constant along a particular coordinate value θ provides a plasma which is radially symmetric along θ. The amplitudes of the peak-to-peak r.f. currents in the two substantially semicircular, equal radius segments 40 and 42 are significantly less than the amplitudes of the currents in the other segments. Segments 40 and 42 derive sufficient magnetic fluxes which are spatially averaged with the magnetic fluxes derived from the other segments 44, 46 and 48 so a substantially uniform plasma flux is generated at the level of the processed surface of workpiece 32 across the diameter of the chamber.

The electrostatic (i.e., capacitive) coupling of the voltages to the plasma for different portions of planar coil 24 (for example, between portions of loop segments 46 and 48 at the same angular coordinate position θ) has an influence on the uniformity of the generated plasma flux. The capacitive coupling of these voltages to the plasma depends on the magnitude of the peak-to-peak voltages occurring in the coil segments, as well as the thickness and dielectric material of window 19 which separates the coil from the plasma. The influence of the capacitive currents produced by the r.f. voltages is minimized by causing the highest r.f. peak-to-peak voltages to occur at terminals 52 and 54. The geometry of coil 24 and proper selection of the value of capacitor 80 cause the highest r.f. peak-to-peak voltages to occur at terminals 52 and 54.

R.f. excitation of planar coil 24 produces a substantially planar plasma having a relatively uniform flux completely across workpiece 32, frequently shaped as a disc. Regardless of shape, substrate 32 has exterior edge dimensions only somewhat less than the interior dimensions of plasma processor chamber 10.

Commonly assigned U.S. Pat. No. 5,759,280 and other prior art references disclose a considerable portion of the foregoing description of the drawing, except for the amplitude modulation of the r.f. envelope pulse source 27 imposes on the output of r.f. source 26. I have discovered that varying the amplitude of the envelope of r.f. source 26, particularly pulsing the r.f. source on and off, also enables the plasma flux on workpiece 32 to have greater uniformity than is achieved by source 26 deriving a constant amplitude envelope.

During high amplitude portions of the r.f. envelope, coil 24 supplies a strong toroidal magnetic field to gas and plasma in the interior of vacuum chamber 18, just beneath window 18. Coil 24 also supplies an r.f. electrostatic field to the gas and plasma in chamber 18. The torroidal magnetic field extends in a plane generally parallel to lower face 19 of window 18 and has an axis (where the magnetic field is zero) substantially coincident with center line 50 of coil 24. The strong magnetic field excites charge particles in the plasma to produce free electrons and positive ions. The strong magnetic field prevents substantial diffusion of the charge carries from the torroidal magnetic field to workpiece 32. The r.f. electrostatic field coil 24 couples to chamber 18 accelerates the charge particles toward workpiece 32.

When pulse source 27 turns off r.f. source 26 or causes the r.f. source to produce a low amplitude envelope the torroidal magnetic field collapses and the electrostatic field turns off. Consequently, the charge particles in the plasma are free to diffuse when source 26 derives a zero or low amplitude output.

In one embodiment, pulse source 27 turns off r.f. source 26 for a short enough period, e.g., 10 microseconds, to prevent extinction of the r.f. plasma. In another embodiment, pulse source 21 turns off r.f. source 26 for a long enough period, e.g. 10 milliseconds, to assure extinction of the r.f. plasma. In both embodiments, the unconfined free electrons and positive ions can easily diffuse away from the volume where the confining torroidal magnetic field subsists while r.f. source 26 is on and supplies a large amount of power, e.g., more than 1 kilowatt, to coil 24.

The voltage that source 31 applies to workpiece holder 30 assists in attracting to workpiece 32 the unconfined free electrons and positive ions that can easily diffuse away from the torroidal volume. The unconfined electrons and positive ions that are attracted to workpiece 32 in combination with other factors cause the plasma density incident on workpiece 32 to be substantially uniform. Factors affecting the density of the plasma on workpiece 32 include the pressure within chamber 10 and the usually fixed geometric arrangement of chamber 10, coil 24, workpiece holder 30, and workpiece 32 and variable parameters which are (1) pressure in chamber 10, (2) flow rate and type of processing gas admitted to chamber 10 through port 20, (3) the material and size of workpiece 32, (4) spacing between adjacent pulses source 26 applies to coil 24, which pulse source 27 controls, and (5) peak and minimum amplitudes of the pulse source 26 supplies to coil 24.

A high degree of plasma density uniformity on workpiece 32 has been achieved (as described infra) with a chamber having a wall 12 with an interior circular diameter of 14 inches, a circular window 18 having a 14.7 inch diameter, a coil 24 with a 12 inch diameter, a circular workpiece holder with an 8 inch diameter having an upper face extending parallel to and spaced about 4.7 inches from bottom face 19 of window 18. Modulation of the envelope of the 13.56 mHz r.f. carrier derived by source 26 improves the uniformity of plasma flux, i.e., plasma density, across workpiece 32. Varying the envelope modulations adjusts the plasma processing conditions in order to obtain ion flux uniformity incident on workpiece 32 within a specified uniformity target. This ability to adjust ion flux uniformity for each processing condition provides better plasma processing results across a wider range of operating conditions than would be possible using a conventional inductively coupled plasma source without amplitude modulation of r.f. source 26 by pulse source 27.

The ability of input device 31 and controller 27 to change the duty cycle of the r.f. source 26 derives enables at will control of the etch characteristics of workpiece 32 as a function of the radius of workpiece 32. For example if greater etching of peripheral workpiece regions is desired, input device 31 and controller 29 activate pulse source 27 to cause source 26 to produce a continuous wave, constant amplitude envelope. If maximum etch uniformity is desired input device 31 sets the duty cycle of source 26 at an intermediate value, as discussed infra. If greater etching of the workpiece center region is desired input device 31 and controller 29 cause pulse source 27 to activate r.f. source to produce low duty cycle (e.g., fifteen percent) r.f. output.

To obtain substantial uniformity of plasma flux on workpiece 32, coil 24 has an area substantially exceeding the workpiece area. Actual experiments using the previously described 12 inch diameter coil and chamber involved etching a 200 mm (5.08 inch) workpiece formed of a silicon poly wafer. In one experiment pulse source 27 applied 35 percent duty cycle on and off 50 kHz amplitude modulation to the 13.56 mHz carrier of r.f. source 26 so that source 26 produced 7 microsecond r.f. pulses spaced from each other by 13 microseconds, while the silicon poly wafer was etched by chlorine at a pressure of 5 milliTorr. The thickness of the wafer at different radial and circumferential positions on the wafer upper face exposed to the plasma was monitored after the etching operation to determine the amount of material etched from these different positions. Since the amount of material etched from each position correlates very closely to the plasma density at each position, the thickness measurements determine the plasma densities. The standard deviation ($\sigma$) of these thickness measurements thus provide a measure of the plasma density uniformity incident on the workpiece exposed surface, so that high uniformity is associated with a low standard deviation and vice versa.

The etch standard deviation for the previously described experiment was 1.527 compared to an etch standard deviation of 2.037 for continuous wave (c.w.) operation of source 26 in a second experiment; all factors other than pulse modulation were identical in these two experiments. Similar experiments, under identical conditions except for duty cycle, indicate greater etch uniformity, for duty cycles of source 26 less than 85% than for c.w. operation of source 26 as indicated by the following Table.

TABLE

| duty cycle (%) | etch standard deviation ($\sigma$) |
|---|---|
| 100 (c.w.) | 2.037 |
| 85 | 2.017 |
| 75 | 1.823 |
| 65 | 1.565 |
| 50 | 1.653 |
| 35 | 1.527 |
| 25 | 1.845 |
| 16 | 1.864 |

The substantially reduced etch standard deviation for duty cycles between 16 percent and 75 percent implies substantially greater plasma density uniformity for pulsed (i.e., amplitude modulated) operation of source 26 than for c.w. operation of source 26. The 35 percent duty cycle, in addition to having the greatest etch uniformity, had center and peripheral regions with lower amounts of etched material than an intermediate region between the center and peripheral regions. Hence for the 35 percent duty cycle the density of the plasma incident on the center of the wafer was less than the plasma density on the portion of the wafer surrounding the wafer center portion. This condition, known as center fast, is usually considered highly advantageous, particularly when accompanied by great plasma density uniformity.

The twenty-five percent and sixteen percent duty cycles resulted in greater center etching than intermediate and peripheral etching. The eighty-five percent and seventy-five percent duty cycles resulted in greater peripheral etching than intermediate and center etching. Hence, varying the duty cycle enables tailoring of the etch rate as a function of radius.

While there have been described and illustrated plural specific embodiments of the invention, it will be clear that variations in the details of the embodiment specifically illustrated and described may be made without departing from the is true spirit and scope of the invention as defined in the appended claims.

I claim:

1. A vacuum plasma processor for processing workpieces comprising a vacuum chamber for processing the workpieces with a plasma, a holder in the chamber for the workpieces, a coil for exciting gas in the chamber into the plasma, an r.f. source for supplying to the coil an r.f. carrier having a variable amplitude envelope;

the variable amplitude, pressure within the chamber, and the arrangement of (a) the coil, (b) the chamber and (c) the holder being such as to cause the plasma to have a substantially constant flux across the workpiece while the workpiece is on the holder.

2. The vacuum plasma processor of claim 1 wherein the variable amplitude is in the form of pulses.

3. The vacuum plasma processor of claim 2 wherein the pulses cause the r.f. envelope to have zero amplitude.

4. The vacuum plasma processor of claim 3 wherein the spacing between adjacent pulses is approximately ten microseconds.

5. The vacuum plasma processor of claim 4 wherein the coil includes interior and exterior arcuate segments and first and second excitation terminals adapted to be connected to the r.f. source, the first terminal being at one end of the coil and at one end of the interior arcuate segment, the exterior arcuate segment being radially displaced from the interior arcuate segment, the second terminal being at one of the arcuate segments different from the interior arcuate segment, one of the terminals of the coil being connected to the r.f. source by a reactance, the value of the reactance, the length of the coil and the r.f. energization having a frequency such that peak-to-peak r.f. voltages $V_{pkpk}(x)$ and currents $I_{pkpk}(x)$ in the coil are approximated by $$V_{pkpk}(x) = V^\circ_{pkpk} \cos[\beta(x+x^\circ)]$$

and $$I_{pkpk}(x) = I^\circ_{pkpk} \sin[\beta(x+x^\circ)],$$

where:

x is the linear distance measured from an input terminal of the coil connected to the source, $\beta$ is a constant determined by the frequency of the r.f. energization, $x^\circ$ is an off set from zero determined by the impedance of the reactance at the frequency of the r.f. energization, and $V^\circ_{pkpk}$ and $I^\circ_{pkpk}$ are values of the maximum r.f. peak-to-peak voltages and currents in the coil.

6. The vacuum plasma processor of claim 4 wherein the r.f. source is connected to first and second terminals of the coil such that the magnitude of a peak-to-peak r.f. voltage in the coil has a maximum value with a first polarity at the first terminal of the coil and a maximum value with a second polarity at the second terminal of the coil.

7. The vacuum plasma processor of claim 4 wherein the coil includes several arcuate segments having an arcuate extent of about a turn, including an outermost arcuate segment having an arcuate extent of about a turn and a next outermost arcuate segment having an arcuate extent of about a turn, the r.f. source being connected to the coil and the coil being configured such that r.f. current in the outermost arcuate segment and the next outermost arcuate segment is substantially greater than current in an interior segment of the coil.

8. The vacuum plasma processor of claim 4 wherein the r.f. source is connected to first and second terminals of the coil and the coil is such that the magnitude of peak-to-peak r.f. current at the first terminal is approximately equal to the peak-to-peak r.f. current at the second terminal, the equal currents at the first and second terminals having amplitudes lower than any other currents in the coil.

9. The vacuum plasma processor of claim 4 further including a reactance connected in series with the coil and the r.f. source, the reactance having a value and connections to the coil and source and the coil having a configuration so there are approximately equal magnitude peak-to-peak r.f. currents at excitation terminals of the coil.

10. The vacuum plasma processor of claim 4 wherein first and second excitation terminals of the coil are located in a center region of the coil, the first and second excitation terminals being respectively connected to first and second arcuate segments having an arcuate extent of about one half a turn, the arcuate segments having an arcuate extent of about one half a turn having about the same dimensions and arranged substantially concentrically such that the first and second terminals are located next to each other.

11. The vacuum plasma processor of claim 1 wherein the chamber has a metal side wall arrangement with a predetermined inner diameter and the coil has a diameter, approximately equal to the predetermined inner diameter, the chamber including a dielectric window substantially at right angles to the wall, the coil being positioned outside the chamber and in proximity to the window so that a field from the coil is coupled to the plasma through the window.

12. The vacuum plasma processor of claim 11 wherein the variable amplitude has low amplitude portions of sufficient duration and magnitude to enable charge particles in the plasma to diffuse in the chamber to a much greater extent than charge particle diffusion which occurs when the variable amplitude has a high value which excites the plasma to a state which causes processing of the workpiece.

13. The vacuum plasma processor of claim 12 wherein the duration and amplitude of the low amplitude portion are such that the plasma is not extinguished between adjacent high amplitude portions.

14. The vacuum plasma processor of claim 12 wherein the duration and amplitude of the low amplitude portion are such that the plasma is extinguished between adjacent high amplitude portions.

15. The vacuum plasma processor of claim 1 wherein the variable amplitude has low amplitude portions of sufficient duration and magnitude to enable charge particles in the plasma to diffuse in the chamber to a much greater extent than charge particle diffusion which occurs when the variable amplitude has a high value which excites the plasma to a state which causes processing of the workpiece.

16. The vacuum plasma processor of claim 15 wherein the duration and amplitude of the low amplitude portion are such that the plasma is not extinguished between adjacent high amplitude portions.

17. The vacuum plasma processor of claim 15 wherein the duration and amplitude of the low amplitude portion are such that the plasma is extinguished between adjacent high amplitude portions.

18. The vacuum plasma processor of claim 1 wherein the pressure within the chamber, and the arrangement of (a) the coil, (b) the chamber and (c) the holder are such as to cause the plasma to have a higher flux on a portion of the workpiece aligned with a center portion of the coil than on a portion of the workpiece aligned with a portion of the coil removed from the center portion of the coil when a constant amplitude r.f. envelope is applied to the coil, the variable amplitude envelope being such as to cause the plasma flux across the workpiece to be substantially constant.

19. A method of plasma processing a workpiece on a holder in a vacuum plasma processor chamber comprising exciting gas in the chamber to a plasma by applying an r.f. carrier having envelope amplitude variations to a coil, the coil responding to the r.f. carrier to couple magnetic and electric plasma excitation fields to the plasma; the variations of the envelope amplitude and the coil, chamber, workpiece and holder parameters being such that the density of the plasma across the workpiece has substantially lower standard deviation than when the plasma envelope has a constant amplitude.

20. The method of claim 19 wherein the coil diameter is greater than the workpiece diameter.

21. The method of claim 19 wherein the coil is such that there is a higher plasma flux on a portion of the workpiece aligned with the center of the coil than on a portion of the workpiece aligned with a portion of the coil removed from the center of the coil when a constant amplitude r.f. envelope is applied to the coil, and varying the amplitude of the envelope such as to cause the plasma flux across the workpiece to be substantially constant.

22. A method of plasma processing a workpiece on a holder in a vacuum plasma processor chamber comprising exciting gas in the chamber to a plasma by applying an r.f. carrier having envelope amplitude variations to a coil, the coil responding to the r.f. carrier to couple magnetic and electric plasma excitation fields to the plasma;

maintaining the density of the plasma across the workpiece substantially constant by controlling the variations of the envelope amplitude so the plasma density across the workpiece has a substantially lower standard deviation while the plasma envelope has the amplitude variations than when the plasma envelope has a constant amplitude.

23. The method of claim 22 wherein the variable amplitude is in the form of pulses.

24. The method of claim 23 wherein the pulses cause the r.f. envelope to have zero amplitude.

25. The method of claim 22 wherein the variable amplitude has low amplitude portions of sufficient duration and magnitude to enable charge particles in the plasma to sequentially diffuse in the chamber to a much greater extent than charge particle diffusion which occurs when the variable amplitude has a high value which excites the plasma to a state which causes processing of the workpiece.

26. The method of claim 25 wherein the duration and amplitude of the low amplitude portion are such that the plasma is not extinguished between adjacent high amplitude portions.

27. The method of claim 25 wherein the duration and amplitude of the low amplitude portion are such that the plasma is extinguished between adjacent high amplitude portions.

28. The method of claim 22 wherein the coil diameter is greater than the workpiece diameter.

29. A vacuum plasma processor for processing workpieces comprising a vacuum chamber for processing the workpieces with a plasma, a holder in the chamber for the workpieces, a coil for exciting gas in the chamber into the plasma, an r.f. source for supplying to the coil an r.f. carrier having a variable amplitude envelope;

the variable amplitude, pressure within the chamber, and the arrangement of (a) the coil, (b) the chamber and (c) the holder being such as to cause the plasma to have a higher flux on a portion of the workpiece aligned with a center portion of the coil than on a portion of the workpiece aligned with a portion of the coil removed from the center portion of the coil when a constant amplitude r.f. envelope is applied to the coil, the variable amplitude envelope being such as to cause the plasma flux across the workpiece to be such as to cause the plasma flux in a portion of the workpiece removed from the portion of the workpiece aligned with the center portion of the coil to be at least equal to the plasma flux in the portion of the workpiece aligned with the center portion of the coil.

30. The vacuum plasma processor of claim 29 wherein the source is arranged so the envelope amplitude has differing values to cause the plasma flux across the workpiece to be substantially constant.

31. The vacuum plasma processor of claim 29 wherein the source is arranged so the envelope amplitude has differing values to cause the plasma flux across the workpiece to be such that the plasma flux on a peripheral portion of the workpiece is greater than the plasma flux on interior portions of the workpiece.

32. The vacuum plasma processor of claim 29 wherein the source is arranged so the envelope includes segments with controllable high amplitudes and segments with controllable duration low amplitude segments, the high amplitude segments being spaced from each other by the low peak amplitude segments, the source being arranged so that the amplitude of the high amplitude segments increases with increases in the spacing of the high amplitude segments from each other.

33. The vacuum plasma processor of claim 32 wherein the source is arranged to change the amplitudes and durations of the high and low amplitude segments to cause the time averaged power of the plasma flux incident on the workpiece to be substantially constant even though the amplitudes and durations change.

34. A vacuum plasma processor for processing workpieces comprising a vacuum chamber for processing the workpieces with a plasma, a holder in the chamber for the workpieces, a coil for exciting gas in the chamber into the plasma, an r.f. source for supplying to the coil an r.f. carrier having a variable amplitude envelope;

the source being arranged so the envelope includes variable amplitude, high amplitude segments spaced from each other by low amplitude segments, the source being arranged so the envelope includes segments with controllable high amplitudes and segments with controllable duration low amplitude segments, the high amplitude segments being spaced from each other by the low peak amplitude segments, the source being arranged so that the amplitude of the high amplitude segments increases with increases in the spacing of the high amplitude segments from each other.

35. The vacuum plasma processor of claim 34 wherein the source is arranged to change the amplitudes and durations of the high and low amplitude segments to cause the time averaged power of the plasma flux incident on the workpiece to be substantially constant even though the amplitudes and durations change.

36. A method of plasma processing a workpiece on a holder in a vacuum plasma processor chamber comprising exciting gas in the chamber to a plasma by applying an r.f. carrier having envelope amplitude variations to a coil, the coil responding to the r.f. carrier to couple magnetic and electric plasma excitation fields to the plasma, the pressure within the chamber, and the arrangement of (a) the coil, (b) the chamber and (c) the holder being such as to cause the plasma to have a higher flux on a portion of the workpiece aligned with the center of the coil than on a portion of the workpiece aligned with a portion of the coil removed from the center of the coil when a constant amplitude r.f. envelope is applied to the coil;

and controlling the variable amplitude envelope so that the plasma flux on a portion of the workpiece removed from the portion of the workpiece aligned with the center of the coil is at least equal to the plasma flux at the portion of the workpiece aligned with the center of the coil.

37. The method of claim 36 wherein the variable amplitude envelope is controlled such that the plasma flux on a peripheral portion of the workpiece is greater than the plasma flux on interior portions of the workpiece.

38. The method of claim 36 wherein the source is arranged so the envelope includes segments with controllable high amplitudes and segments with controllable duration low amplitude segments, the high amplitude segments being spaced from each other by the low amplitude segments, the source being arranged so that the amplitude of the high amplitude segments increases with increases in the spacing of the high amplitude segments from each other.

39. The method of claim 38 wherein the source is controlled to change the amplitudes and durations of the high and low amplitude portions to cause the time averaged power of the plasma flux incident on the workpiece to be substantially constant even though the amplitudes and durations change.

* * * * *